(12) United States Patent
Huang et al.

(10) Patent No.: US 6,246,111 B1
(45) Date of Patent: Jun. 12, 2001

(54) UNIVERSAL LEAD FRAME TYPE OF QUAD FLAT NON-LEAD PACKAGE OF SEMICONDUCTOR

(75) Inventors: Chien-Ping Huang, Hsinchu Hsien; Eric Ko, Taichung Hsien, both of (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/490,726

(22) Filed: Jan. 25, 2000

(51) Int. Cl.[7] .................................................. H01L 23/495
(52) U.S. Cl. ......................... 257/675; 257/666; 257/667; 257/706; 257/707; 257/713; 257/717
(58) Field of Search .................................. 257/675, 796, 257/706–707, 666, 713, 717

(56) References Cited

U.S. PATENT DOCUMENTS

| | | | |
|---|---|---|---|
| 5,278,446 | * | 1/1994 | Nagaraj et al. ........................ 257/707 |
| 5,345,106 | * | 9/1994 | Doering et al. ....................... 257/675 |
| 5,389,739 | * | 2/1995 | Mills ..................................... 174/52.4 |
| 5,583,371 | * | 12/1996 | Hri ........................................ 257/675 |
| 5,604,378 | * | 2/1997 | Kimura et al. ........................ 257/706 |
| 5,691,567 | * | 11/1997 | Lo et al. ............................... 257/675 |
| 5,990,554 | * | 11/1999 | Golubic et al. ....................... 257/734 |

* cited by examiner

*Primary Examiner*—Tom Thomas
*Assistant Examiner*—Nitin Parekh
(74) *Attorney, Agent, or Firm*—Jiawei Huang; J. C. Patents

(57) ABSTRACT

An universal lead frame type of Quad Flat Non-Lead package of semiconductor comprises a chip, a plurality of leads, a heat sink, and a molding compound. The leads are disposed at the periphery of the chip. The chip has its back surface bonded to the top surface of the heat sink, and the periphery of the top surface of the heat sink has a plurality of projections. The bonding portion at the periphery on the bottom surface of the heat sink is bonded to the top surface of the leads. The protruded portion at the center of the bottom surface of the heat sink is disposed in the opening region such that the bottom surface of the heat sink and the bottom surface of the leads are coplaner. The bonding pads of the chip are electrically connected to the top surface of the leads by a plurality of bonding wires. The molding compound encapsulates the chip, the heat sink, the top surface of the leads, and the bonding wires while exposes the protruded portion of the heat sink.

11 Claims, 4 Drawing Sheets

UNIVERSAL LEAD FRAME TYPE OF QUAD FLAT NON-LEAD PACKAGE OF SEMICONDUCTOR

BACKGROUND OF THE INVENTION

1. Field of the Invention

This invention relates to a Quad Flat Non-Lead package of semiconductor, and more particularly to a Quad Flat Non-Lead package of semiconductor that can share an universal lead frame to fit various sizes of chip.

2. Description of Related Art

Following the evolution of the integrated circuit technology, the manufacturing process of integrated circuit has been advanced to ever high in integration with a target of pursuing ever dense package structure in the packaging process of the back end process. The chip scale package (CSP), which has been actively developed and manufactured by the semiconductor industry, has its package size slightly larger than the size of the chip. Therefore, the chip scale package not only can diminish its occupied volume, but also can shorten the path of signal transmission, thereby, it can enhance the product's performance. The carrier employed by the chip scale package includes lead frame, flexible substrate, and rigid substrate etc. The lead-frame-based chip scale package has become a popular consumer electronic product since the lead frame it employed is low in cost and high in workability, thereby, the lead-frame-based chip scale package has become a popular chip scale package.

FIG. 1 is a cross-sectional view of a Quad Flat Non-Lead package of a semiconductor according to the prior art. FIG. 2 is a bottom view corresponding to FIG. 1 according to the prior art. As shown in FIG. 1 and FIG. 2, the structure of the Quad Flat Non-Lead package which has disclosed in the U.S. Pat. No. 5,942,794 (Matsushita, 1999) is constructed on a lead frame and is having a die pad 100 surrounded by a multiple leads 102. The chip 104 includes an active surface 106 and a back surface 108. And a plurality of bonding pads 110 for external connections of the chip 104 is disposed on the active surface 106. The chip 104 has its back surface 108 bonded to the die pad 100 by the use of an adhesive 112 while the bonding pads 110 are electrically connected to the leads 102 respectively by the use of bonding wires 114. What is more, a molding compound 116 normally encapsulates the whole chip 104, the die pad 100, the bonding wires 114, and the top surface 118a of the lead 102. This encapsulating process exposes the bottom surface 118b and the side surface 118c of the leads 102 for external connections of the whole package structure 120.

In the conventional structure of the Quad Flat Non-Lead package, the die pad 100 is upward offset in order to make the chip 104 and leads 102 positioned at different levels of surface. An object of the upward offset of the die pad 100 is that the package can be applied in a relatively large chip in order to make it relatively more flexible in its range of application. The other object is to increase the bondability between the molding compound 116 and the lead frame. However, because of the demand for diminishing the thickness of the package, this conventional package structure is apt to expose the bonding wire 114 while encapsulating, thereby, the yield of the product become lower. Additionally, as the operating speed of the device of the integrated circuit becomes faster and faster nowadays, the heat generated increases accordingly, and since the conventional package structure is unable to provide a better way of heat dissipation, the performance of the electronic device will be affected.

FIG. 3 is a cross-sectional view of another kind of Quad Flat Non-Lead package of a semiconductor according to the prior art and FIG. 4 is a bottom view corresponding to FIG. 3 according to the prior art. As shown in FIG. 3 and FIG. 4, this type of package was presented in a paper titled as "Micro Lead Frame Package" by Amkor Company. The package is constructed on a lead frame that includes a die pad 200 which has a plurality of leads 202 surrounding the die pad 200. The chip 204 has an active surface 206 and a back surface 208. On the active surface 206, there is a plurality of bonding pads 210 for external connections. The back surface 208 of the chip 204 is bonded to the top surface 222a of the die pad 200 by an adhesive 212 while the bonding pads 210 are electrically connected to the top surface 218a of the leads 202 respectively by the bonding wire 214. A molding compound 216 encapsulates the whole chip 204, the bonding wires 214, and the top surface 218a of the lead 202 while exposes the bottom surface 218b and the side surface 218c of the lead 202 for external connections. In additions, the die pad 200 is generally grounded through a bonding wire 214a in order to improve the electrical performance by reducing interference.

Unlike the conventional Quad Flat Non-Lead package shown in FIG. 1, the feature of this kind of conventional Quad Flat Non-Lead package is that the die pad 200 is not upward offset but is exposed in order to enhance the heat-dissipating effect. Despite that this kind of package structure can improve the heat-dissipating effect, it has a disadvantage. In order to accommodate different sizes of the chip 204, the dimension of the die pad 200 and the disposition of the leads 202 need to be adjusted and modified all over. This is because that the die pad 200 is positioned at the same level as the leads 202, and the size of the die pad 200 is slightly greater than the size of the chip 204. Accordingly, the stamping tool employed in the lead frame fabrication process needs to be changed that will increase the manufacturing cost.

In additions, since both the above-mentioned two kinds of Quad Flat Non-Lead package employ half-mold in the encapsulating process, it can not provide appropriate fixture for the die pad and the lead, as a result, the surfaces intended to expose has a flash 224 generated as shown in FIG. 4. Consequently, an extra step is necessary to remove the flash 224 by grinding lest it will affect the package reliability in the subsequent surface mount technology (SMT) process, thereby, it will increase the manufacturing cost.

SUMMARY OF THE INVENTION

Therefore, it is the first objective of the present invention to provide an universal lead frame type of Quad Flat Non-Lead package that can share an universal lead frame and its related stamping tool to accommodate different sizes of chip so as to improve the manufacturing flexibility.

It is the second objective of the present invention to provide an universal lead frame type of Quad Flat Non-Lead package capable of enchancing the heat-dissipating effect and improving the performance of the integrated circuit.

It is the third objective of the present invention to provide an universal lead frame type of Quad Flat Non-Lead package to avoid the flash phenomenon in order to simplify the manufacturing process and lower the manufacturing cost.

In order to attain the foregoing and other objectives, the present invention provides an universal lead frame type of Quad Flat Non-Lead package of semiconductor that comprises a chip, a plurality of leads, a heat sink, and a molding compound. The leads are disposed at the periphery of the chip. The chip has its back surface bonded to the top surface of the heat sink, and the periphery of the top surface of the heat sink has a plurality of projections. The bonding portion at the periphery and on the bottom surface of the heat sink is bonded to the top surface of the leads. The protruded portion at the center of the bottom surface of the heat sink is disposed in the opening region such that the bottom surface of the heat sink and the bottom surface of the leads are coplanar. The bonding pads of the chip are electrically connected to the top surface of the leads by a plurality of bonding wires. The molding compound encapsulates the chip, the heat sink, the top surface of the leads, and the bonding wires while exposes the protruded portion of the heat sink.

According to a preferred embodiment of the present invention, the bonding portion which is at the periphery of the heat sink also comprises a plurality of through holes for improving the "mold flow" during the encapsulating process. The bottom surface of the leads appears a stepped structure such that the lead has a protruded region with a relatively thin thickness. The molding compound encapsulates the protruded region on the bottom surface of the leads for improving the bondability between the leads and the molding compound.

BRIEF DESCRIPTION OF DRAWINGS

The foregoing and other objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1:
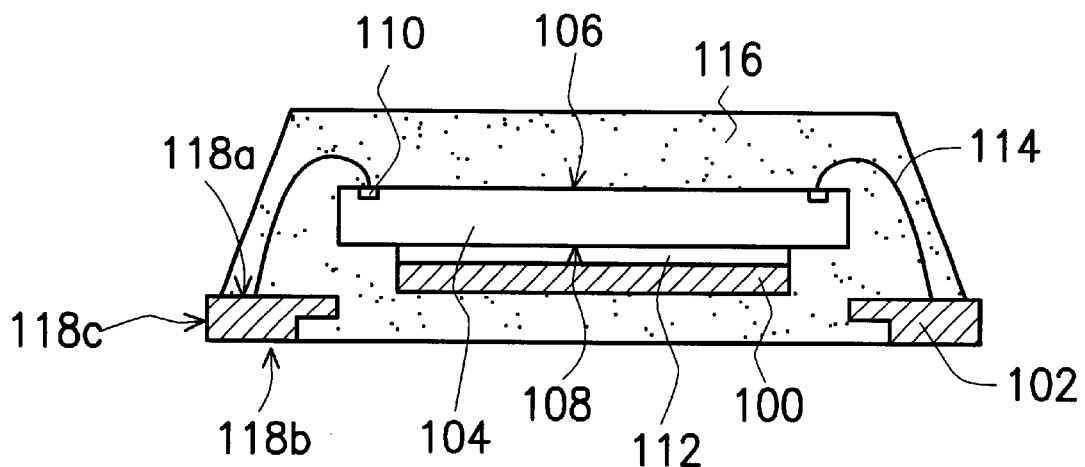
FIG. 1 is a cross-sectional view of a Quad Flat Non-Lead package of a semiconductor according to the prior art.
Figure 2:
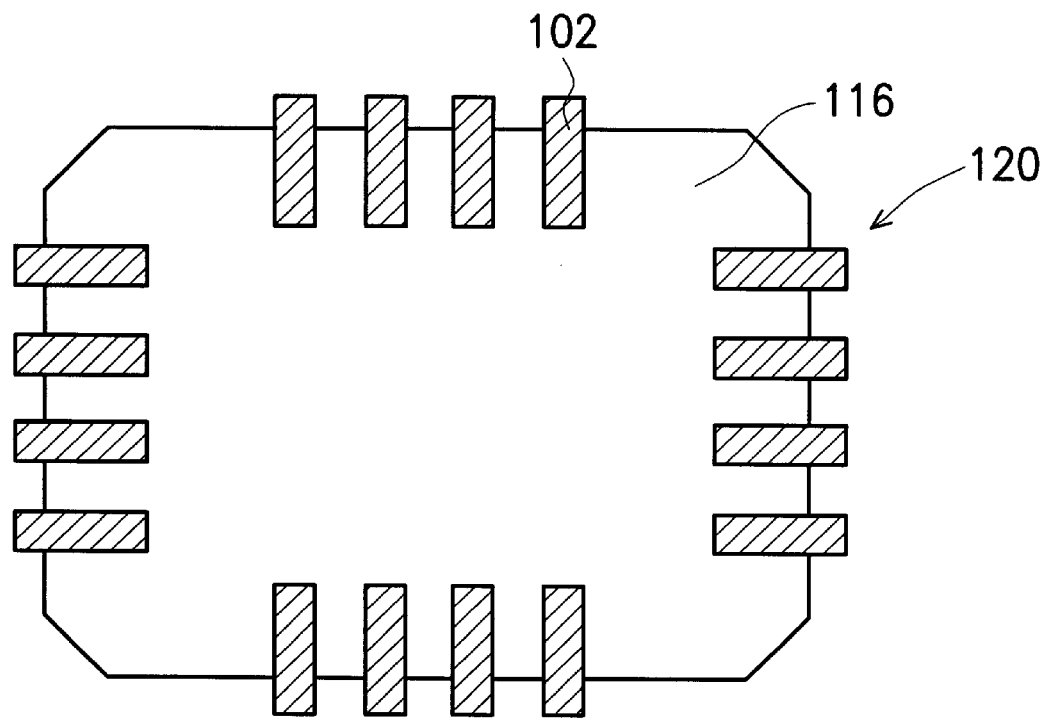
FIG. 2 is a bottom view corresponding to FIG. 1 according to the prior art.
Figure 3:
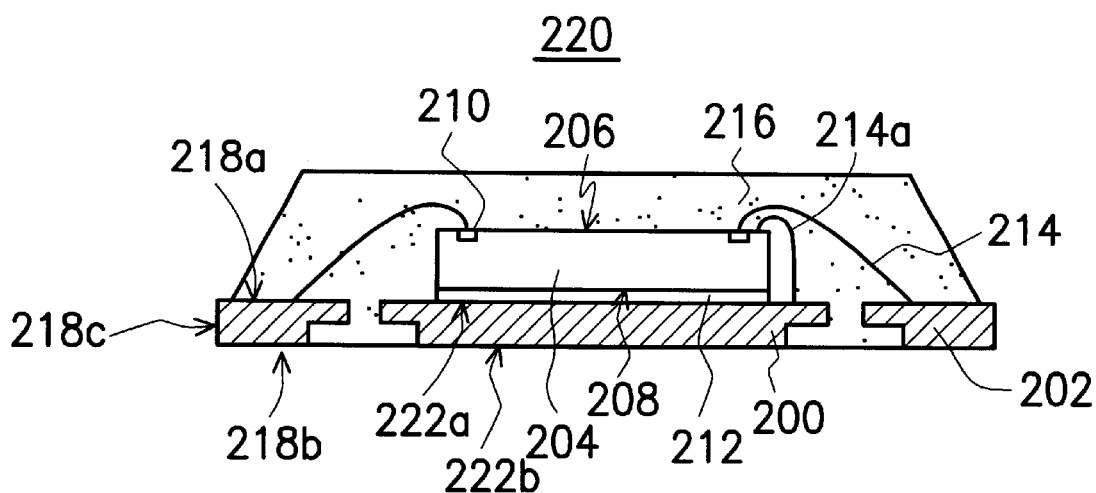
FIG. 3 is a cross-sectional view of another kind of Quad Flat Non-Lead package of a semiconductor according to the prior art.
Figure 4:
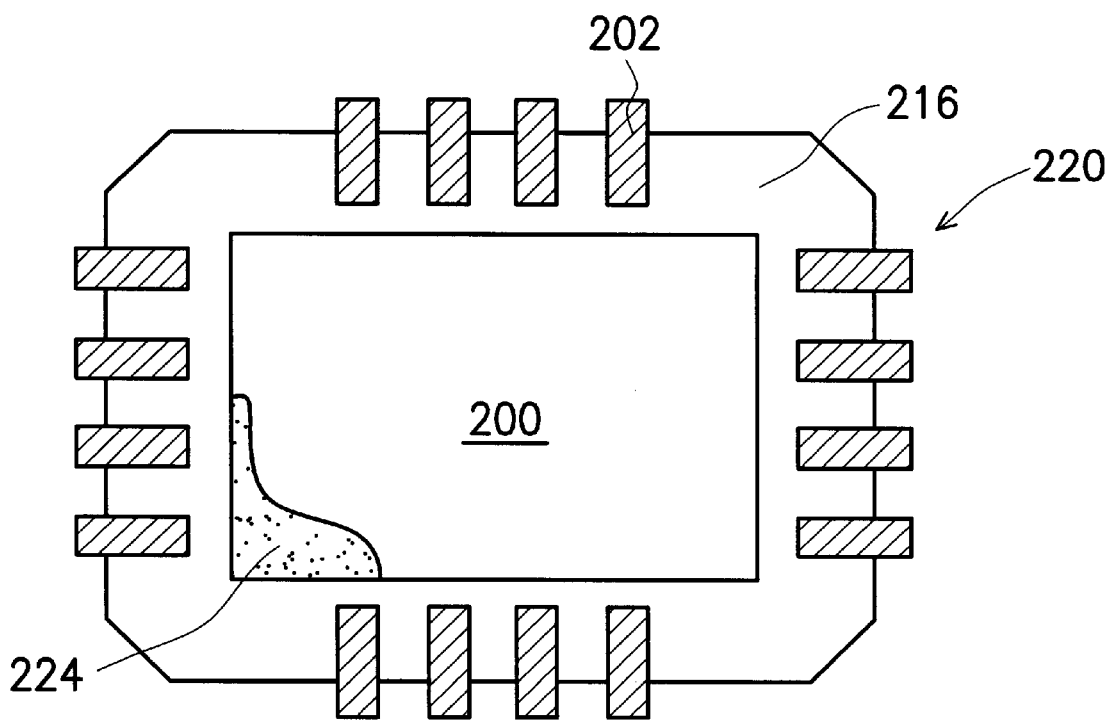
FIG. 4 is a bottom view corresponding to FIG. 3 according to the prior art.
Figure 5:
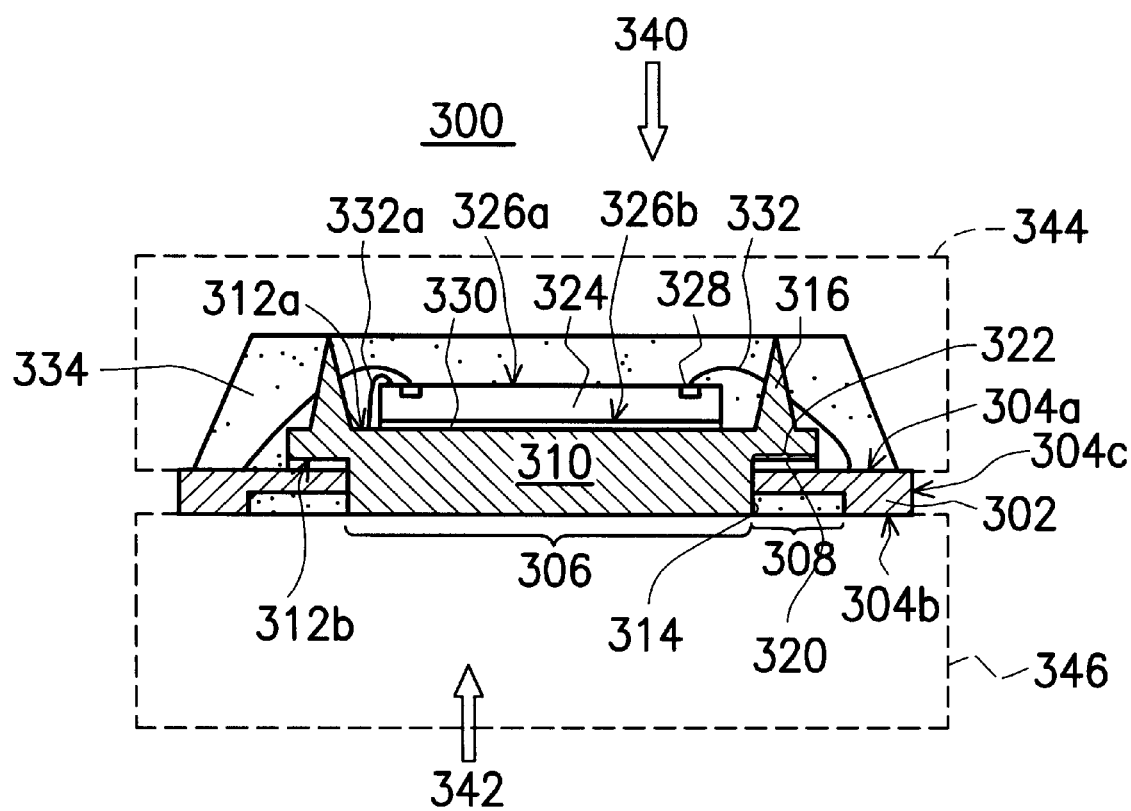
FIG. 5 is a cross-sectional view of an universal lead frame type of Quad Flat Non-Lead package of a preferred embodiment of the present invention.
Figure 6:
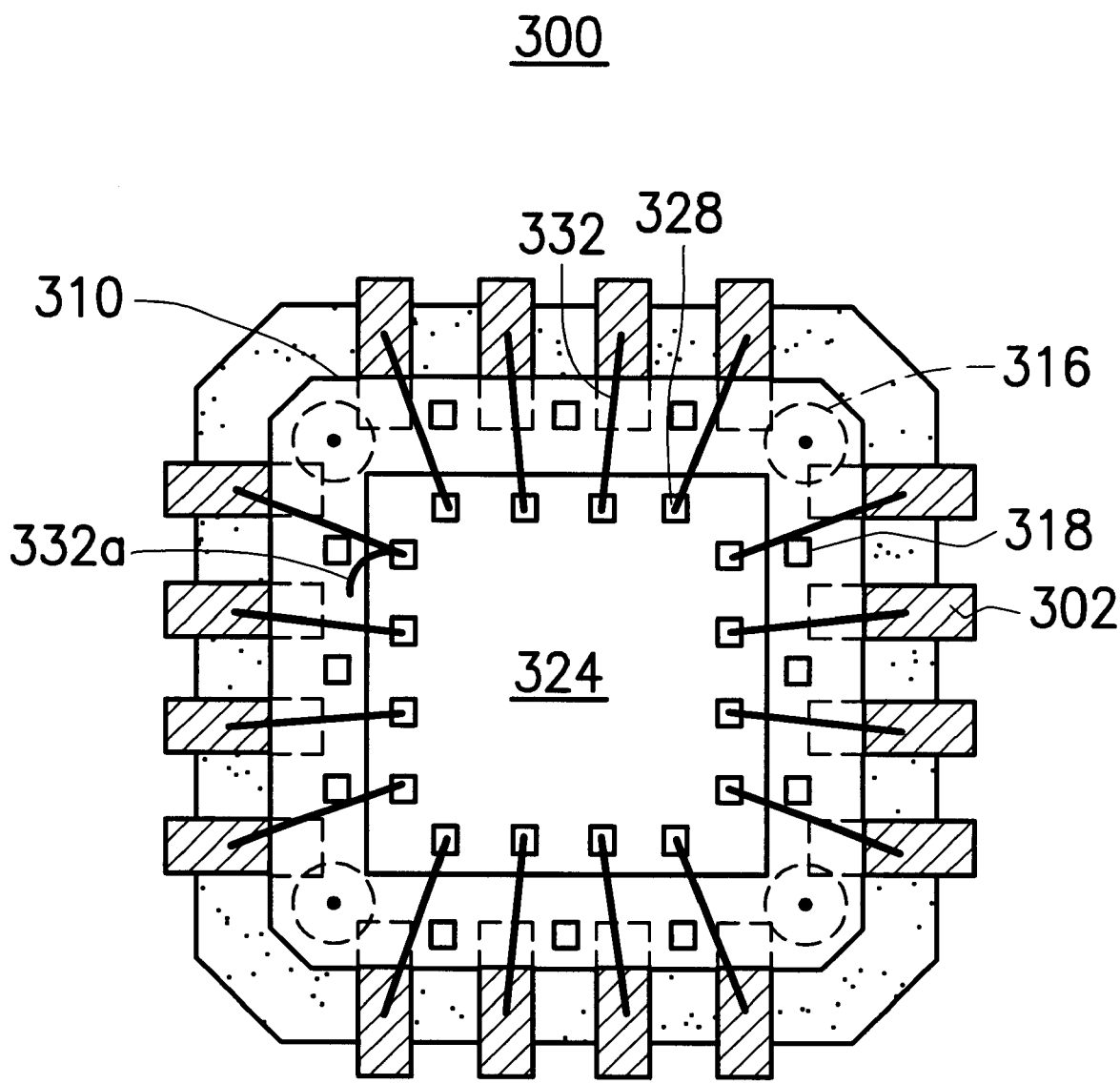
FIG. 6 is a top view corresponding to FIG. 5 of the present invention.

Shown in FIG. 5 is a cross-sectional view of an universal lead frame type of Quad Flat Non-Lead package of a preferred embodiment of the present invention while FIG. 6 is a top view corresponding to FIG. 5 of the present invention. As shown in FIG. 5, and FIG. 6, the lead frame employed by the universal lead flame type of Quad Flat Non-Lead package of the present invention is constituted by a plurality of leads 302 disposed at the perimeter of the chip 324 and surrounding the chip 324. And an opening region 306 is formed at the center of the lead frame. Each of the leads 302 has a first surface 304a (top surface), a second surface 304b (bottom surface), and a side surface 304c. Preferably, the lead 302 is designed to have the second surface 304b form a stepped structure including a relatively thinner protruded region 308 in order to improve the bondability in the subsequent encapsulating process between the leads 302 and the molding compound 334. And the leads 302 preferably extend to the opening region 306 in order to accommodate its application in various sizes of the chip 324.

In the Quad Flat Non-Lead package of the present invention, the die pad of the conventional package is replaced by a heat sink 310. The heat sink 310 has a first surface 312a (top surface) and a second surface 312b (bottom surface) wherein a plurality of projections 316, preferably cone-shaped, is located at the corners of the first surface 312a. A bonding portion 322 at the periphery of the second surface 312b of the heat sink 310 is bonded to the first surface 304a of the lead 302 by an adhesive, preferably an insulative bonding tape 320. A protruded portion 314, which is at the center corresponding to the opening region 306, is extended from the opening region 306 wherein the bottom surface of the protruded region 314 and the second surface 304b of the lead 302 are coplanar. Besides, in order to facilitate the "mold flow" in the subsequent encapsulating process, a plurality of "through holes" 318 (see FIG. 6) is disposed in the bonding portion 322 at the periphery of the heat sink 310, preferably is disposed between the leads 302. The protruded portion 314, which is disposed at a location corresponding to the opening region 306, can be used for positioning when the bonding process between the heat sink 310 and the lead frame is performed. Moreover, the surface area of the heat sink 310 of the present invention is relatively larger than that of the conventional one, thereby can provide better heat-dissipating effect.

The chip 324 has an active surface 326a and a corresponding back surface 326b wherein there is a plurality of bonding pad 328 disposed on the active surface 326a of the chip 324 for external connections. The back surface 326b of the chip 324 is bonded to the first surface 312a of the heat sink 310 by an adhesive 330, preferably a conductive paste, to facilitate the dissipation of the heat, which is generated by the chip, through the heat sink 310. The bonding pads 328 are electrically connected to the first surface 304a of the leads 302 respectively by a plurality of bonding wires 332, preferably gold wires, aluminum wires etc. What is more, the heat sink 310 can also be grounded by ground wires 332a to improve the electrical performance of the package.

A molding compound 334 encapsulates respectively the chip 324, the bonding wires 332, the ground wire 332a, the first surface 312a of the heat sink 310, the first surface 304a of the leads 302, and the protruded region 308 on the second surface 304b of the leads 302 to complete a package structure 300. The package structure 300 has a first side 340 (the top surface), and a second side 342 (the bottom surface). The bottom surface of the protruded portion 314 of the heat sink 310 is exposed on the second side 342. The region excluding the protruded region 308 on the second surface 304b of the leads 302 is exposed on the second side 342 while the side surface 304c of the lead 302 is exposed on the side edge of the package structure 300.

During the encapsulating process, a stress from the upper mold 344 of the mold is applied to the projection 316 and compress the heat sink 310 and the leads 302 to make them closely press against the lower cavity plate 346. Thus, when a molding compound 334 is injected into the mold cavity (not shown), it will not seep in either between the protruded portion 314 and the lower cavity plate 346, or will it seep in between the second surface 304b of the lead 302 and the lower cavity plate 346, thereby, the flash phenomenon will not occur. In additions, the height formed by the projection 316 can provide sufficient space for the bonding wires 332 to ascertain that the bonding wires 332 will not be exposed after the encapsulating process to improve the yield. Althrough those packages have same number of leads and can be applied in different electronic products, the size of chips of integrated circuit varies according to the type of products to which the chips is directed to. If chips with different sizes can share the same lead frame, the packaging process can be more flexible. It can reduce the expenditure on using different lead frames such as the related fixtures and stamping tools etc. It can also reduce the inventory generated by using a variety of lead frames. For this purpose, the universal lead frame type of Quad Flat Non-Lead package provided by the present invention is adapted to different sizes of chip with the same lead frame.

Figure 7:
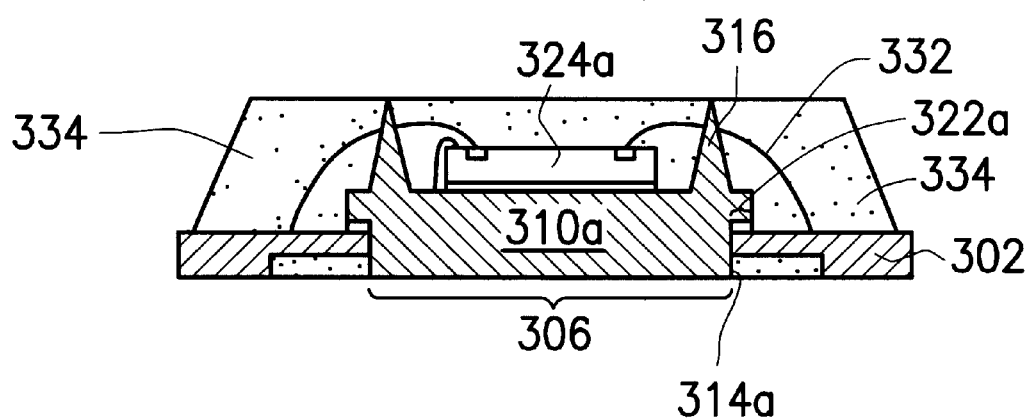
FIG. 7 a cross-sectional view of an universal lead frame type of Quad Flat Non-Lead package of another preferred embodiment of the present invention.

FIG. 7 is a cross-sectional view of an universal lead frame type of Quad Flat Non-Lead package of another preferred embodiment of the present invention. As shown in FIG. 7, if the lead frame shown in FIG. 5 is used for packaging a chip that is relatively smaller than that of FIG. 5, all one has to do is merely to replace the heat sink 310 in FIG. 5 by the heat sink 310a in FIG. 7 with appropriate dimension. Then, the protruded portion 314a of the heat sink 310a is unchanged (since the opening region 306 is unchanged), the only difference is that the dimension of the bonding portion 322a is diminished. Therefore, the manufacturing flexibility can be improved and the manufacturing cost can be reduced since the lead frame and the related stamping tool can be shared without modification.

To summarize the foregoing illustration disclosed by preferred embodiments of the present invention, the universal lead frame type of Quad Flat Non-Lead package of semiconductor of the present invention comprise the following advantages:

1. The universal lead frame type of Quad Flat Non-Lead package of semiconductor of the present invention can improve the manufacturing flexibility and lower the manufacturing cost. This is because that the same lead frame and its related stamping tool can be shared when they are applied in different sizes of chip.
2. The universal lead frame type of Quad Flat Non-Lead package of semiconductor of the present invention can enhance the heat-dissipating effect of the package structure since its heat sink has a relatively large surface area comparing with the conventional ones.
3. The universal lead frame type of Quad Flat Non-Lead package of semiconductor of the present invention can simplify the manufacturing process and lower the manufacturing cost to ascertain the reliability of the subsequent SMT process. This is because that the special projection design of the present invention can avoid the occurrence of the "flash" phenomenon during the encapsulating process.
4. The universal lead frame type of Quad Flat Non-Lead package of semiconductor of the present invention can provide sufficient space for the bonding wires without exposing them while performing encapsulating to ascertain the yield because of the special projection design on the heat sink.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. An universal leadframe type of Quad Flat Non-Lead package of semiconductor, comprising:
   a chip, having an active surface and an opposite back surface wherein the, active surface comprises a plurality of bonding pads;
   a plurality of leads, disposed around the periphery of the chip and surrounding the chip to form an opening region at the center, and having a first surface and an opposite second surface;
   a heat sink, having a first top surface and a second surface, wherein the chip has its back surface bonded to the first top surface of the heat sink, and the heat sink comprises a plurality of projections on the first top surface within a periphery portion of the heat sink, and the heat sink comprises a bonding portion on the second surface within the peripheral portion of the heat sink, and a voluminal portion that protrudes from the second surface for engaging with the opening region, the bonding portion is bonded to the first surface of the leads, and the voluminal portion extends into the opening region such that a surface of the voluminal portion and the second surface of the leads are coplanar, and an extremity of the leads is proximate to the voluminal portion;
   a plurality of bonding wires, that electrically connects the bonding pads of the chip to the first surface of the leads respectively; and
   a molding compound, encapsulating the chip, the heat sink, the first surface of the leads, and the bonding wires, to form a package structure, and the package structure comprises a first side and a second side wherein the molding compound exposes the second surface of the leads on the second side of the package structure, and exposes the bottom surface of the voluminal portion of the heat sink on the second side of the package structure, wherein the extremity of the projections is internally proximate to a boundary surface of the molding compound on the first side.

2. The universal lead frame type of Quad Flat Non-Lead package of semiconductor of claim 1 wherein the molding compound further exposes the side surface of the lead on the side edge of the package structure.

3. The universal lead frame type of Quad Flat Non-Lead package of semiconductor of claim 1 wherein the second surface of the leads appears a stepped structure that makes each of the leads has a protruded region with a relatively thin thickness, and the protruded region is also encapsulated by the molding compound.

4. The universal lead frame type of Quad Flat Non-Lead package of semiconductor of claim 1 wherein the "bonding portion" further comprises a plurality of through holes.

5. The universal lead frame type of Quad Flat Non-Lead package of semiconductor of claim 1 wherein the heat sink is grounded.

6. The universal lead frame type of Quad Flat Non-Lead package of semiconductor of claim 1 wherein the chip is bonded to the heat sink by a thermally conductive paste.

7. The universal lead frame type of Quad Flat Non-Lead package of semiconductor of claim 1 wherein the leads are bonded to bonding portion of the heat sink by an insulative bonding tape.

8. An universal lead frame type of Quad Flat Non-Lead package of semiconductor, comprising:
   a chip having an active surface and a back surface wherein the active surface comprises a plurality of bonding pads;

a plurality of leads having an upper surface and an opposite second surface, disposed around the periphery of the chip and defining a central opening region;

a heat sink having a top surface and a projection portion extruded outwardly from a bottom surface of the heat sink, the projection portion being engaged with the central opening region, wherein the back surface of the chip is bonded to the top surface of the heat sink, and the bottom surface of the heat sink contains a bonding portion for bonding with the upper surface of the leads, wherein the bonding portion of the bottom surface of the heat sink is lower than the top surface of the heat sink and higher than the upper surface of the leads;

a plurality of bonding wires electrically connecting the bonding pads of the chip to the leads respectively; and a molding compound encapsulating the chip, the heat sink, the leads, and the bonding wires to form a package structure, wherein the molding compound exposes at least a portion of the second surface of the leads and at least a portion of a bottom surface of the projection portion of the heat sink.

9. The universal lead frame type of Quad Flat Non-Lead package of semiconductor of claim 8, further comprising a plurality of projections individually separated from one another on the top surface of the heat sink, wherein a distal end of the projections is closely proximate to a boundary surface formed by the molding compound above the chip.

10. An universal lead frame type of Quad Flat Non-Lead package of semiconductor, comprising:

a chip having an active surface and a back surface wherein the active surface comprises a plurality of bonding pads;

a plurality of leads having an upper surface and an opposite second surface, disposed around the periphery of the chip and defining a central opening region;

a heat sink having a top surface and a projection portion extruded outwardly from a bottom surface of the heat sink, the projection portion being engaged with the central opening region, wherein the back surface of the chip is bonded to the top surface of the heat sink, and the bottom surface of the heat sink contains a bonding portion for bonding with the upper surface of the leads, wherein the heat sink comprises a plurality of projections on the top surface of the heat sink;

a plurality of bonding wires electrically connecting the bonding pads of the chip to the leads respectively; and a molding compound encapsulating the chip, the heat sink, the leads, and the bonding wires to form a package structure having a first side and a second side, wherein the molding compound exposes at least a portion of the second surface of the leads and at least a portion of a bottom surface of the projection portion of the heat sink at the second side, and wherein a distal end of the projections on the top surface of the heat sink is substantially at the same level as a boundary surface of the package structure formed by the molding compound at the first side.

11. The universal lead frame type of Quad Flat Non-Lead package of semiconductor of claim 10, wherein the projections on the top surface of the heat sink have a cone shape.

* * * * *